United States Patent [19]

Tamagaki

[11] Patent Number: 5,277,714
[45] Date of Patent: Jan. 11, 1994

[54] VACUUM ARC DEPOSITION DEVICE

[75] Inventor: Hiroshi Tamagaki, Kobe, Japan

[73] Assignee: Kabushiki Kaisha Kobe Seiko Sho, Kobe, Japan

[21] Appl. No.: 810,375

[22] Filed: Dec. 19, 1991

[30] Foreign Application Priority Data

Dec. 25, 1990 [JP] Japan .................. 2-406005

[51] Int. Cl.$^5$ ............................ C23C 14/30
[52] U.S. Cl. .................. 204/192.38; 204/298.41; 118/723 VE
[58] Field of Search .............. 118/723; 204/192.38, 204/298.41

[56] References Cited

U.S. PATENT DOCUMENTS

| 3,836,451 | 9/1974 | Snaper | 204/298.41 |
| 5,037,522 | 8/1991 | Vergason | 204/192.38 |
| 5,061,684 | 10/1991 | Freller | 204/192.38 |
| 5,103,766 | 4/1992 | Yoshikawa | 204/298.41 |

FOREIGN PATENT DOCUMENTS

| 0082654 | 6/1983 | European Pat. Off. |
| 0361265 | 4/1990 | European Pat. Off. |

Primary Examiner—Richard Bueker
Attorney, Agent, or Firm—Oblon, Spivak, McClelland, Maier & Neustadt

[57] ABSTRACT

A vacuum arc deposition device comprising a vacuum vessel with a vacuum arc evaporation source disposed in the vacuum vessel, a plurality of arc current introduction portions are disposed to the vacuum arc evaporation source along with a plurality of arc discharge power sources for supplying arc electric power correspondingly to the plurality of arc current introduction portions. The vacuum arc vapor deposition device provides a large evaporation area and a high film formation rate.

21 Claims, 10 Drawing Sheets

FILM THICKNESS DISTRIBUTION OBTAINED BY CONDUCTING UNIFORM EVAPORATION FROM EVAPORATION SURFACE

FILM THICKNESS DISTRIBUTION OBTAINED BY INCREASING ARC CURRENT AT BOTH ENDS

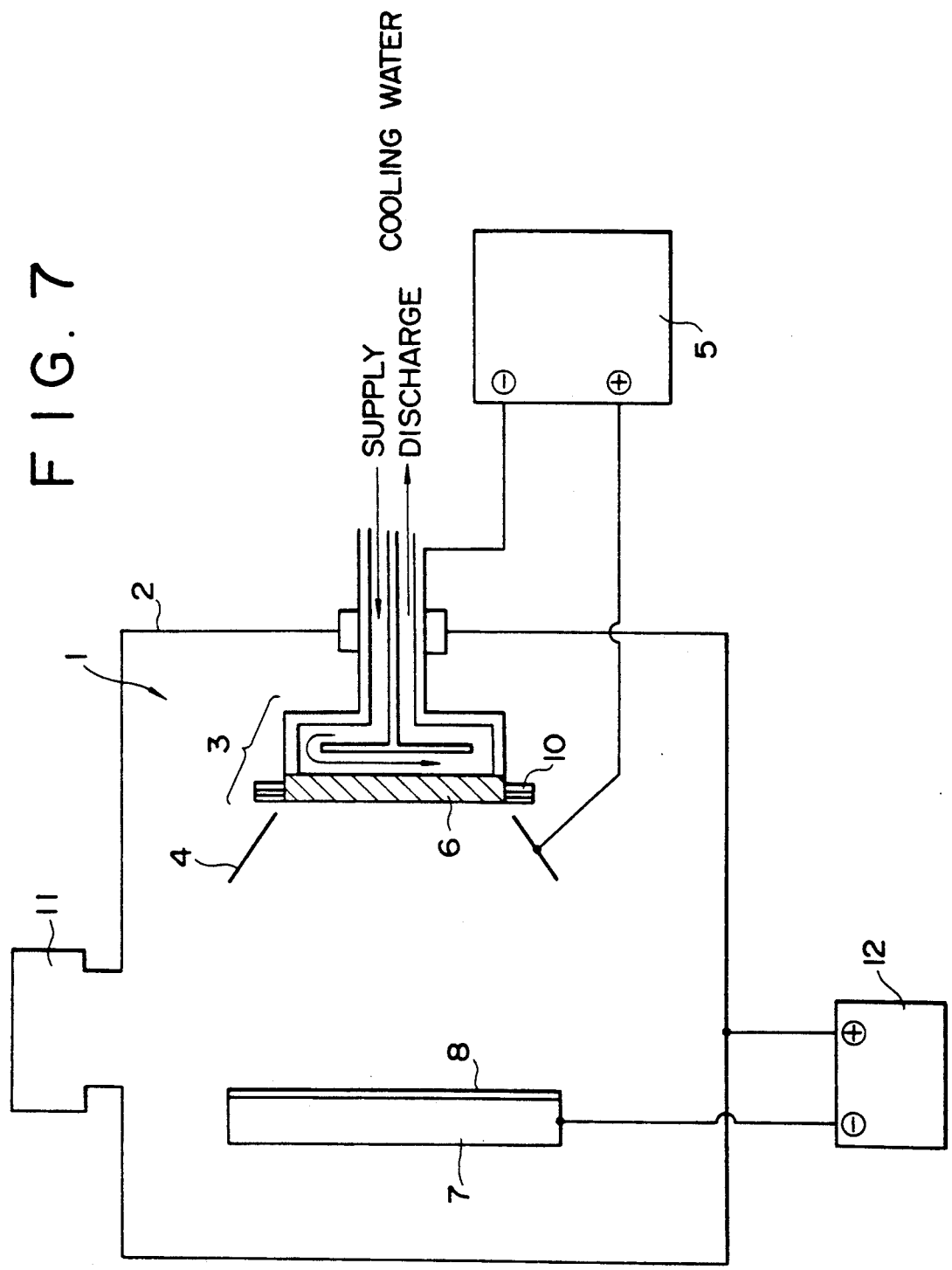

VACUUM ARC DEPOSITION DEVICE

BACKGROUND OF THE INVENTION

1. Field of the Invention

The present invention relates to a vacuum arc deposition device for forming films by utilizing a vacuum arc phenomenon.

2. Description of the Prior Art

Among various methods for forming films in vacuum, a vacuum arc vapor deposition method has industrially been used as a method capable of efficiently forming a hard film such as TiN. The vacuum arc vapor deposition is executed according to such a method as to generate a so-called vacuum cathode arc discharge between a cathode and an anode disposed in a vacuum vessel and to evaporate the cathodic material from an arc spot formed on the surface of the solid cathode, thus depositing the resultant vapor on a substrate disposed in the vacuum vessel to form a film.

As a device for realizing the vacuum arc vapor deposition, there have been known such devices as disclosed in Japanese Patent Publications Nos. Sho 58-3033 and sho 52-14690, which have been variously improved after that. As an evaporation source for a vacuum arc vapor deposition as shown in FIG. 7 is well-known to those skilled in the art.

In FIG. 7, a vacuum arc evaporation source 1 disposed in a vacuum vessel 2 has a cathode 3 and an anode 4. An arc discharge power source 5 is connected between the cathode 3 and the anode 4. A target 6 comprising a material to be evaporated is disposed to the cathode 3. When a vacuum arc discharge is generated under a voltage of several tens of volts and with a current from several tens to several hundreds of amperes, by an ignition mechanism (not illustrated), an arc spot is generated on the surface of the target 6 and vapor is emitted therefrom. The vapor is made to deposit on a substrate 7, to thereby form a film 8. An arc stabilizing mechanism 10 is disposed around the target 6 with an aim for maintaining the surface of the target 6 as a predetermined evaporation surface 9 (disclosed, for example, in Japanese Patent Laid-Open No. Sho 59-208070).

In the drawing, are also shown a vacuum pump 11 and a bias power source 12.

The vacuum arc vapor deposition may provide a high vapor ionization ratio so as to obtain a dense film of high quality and also provides a high film formation rate. Further, the area and shape of the evaporation surface 9 of the target 6 is not constrained by the evaporation process, and many target shapes and sizes may be used. For example, the evaporation surface 9 can be constituted as a circle of 100 mm diameter or as a rectangular shape with 1 m length in the longitudinal direction. The evaporation source 1 having a rectangular evaporation surface 9 is useful for forming a deposition film on a large-sized member or on a sheet-like product of large width, such as, a steel sheet.

However, there has been the following problem in a vacuum arc evaporation source when the evaporation source has a large area. As the evaporation surface is enlarged, the arc average current density at the surface of the evaporation surface is reduced in a reverse proportion with the area so that the vapor deposition rate in front of the evaporation surface is correspondingly reduced. As one of countermeasures therefor, a method for increasing the arc discharge current in accordance with the increase in the evaporation surface may be considered. Indeed, this method can achieve an advantageous effect within a certain extent of an area ratio, but it brings about another problem as the area is further increased.

Namely, an arc current of about 100A is typically required for an evaporation source having an evaporation area of about 100 mm diameter, which is the surface area of targets which are most commonly used. From the simple proportional rule, the discharge current of 300A would be required for an evaporation source having three times of the above area. Further, for an evaporation source having ten times of the above area, the discharge current of 1000A would be required. Although arc discharge at 300A can be coped with using the existent technique, the arc discharge at 1000A or greater causes the following practical problems which are particularly important in an evaporation source for continuous operation.

1. The arc discharge current becomes huge.
2. The diameter of a cable transmitting the arc power is increased along with an increase in current to result in inconvenience for handling. Since the cross section of a cable conductor required for the power transmission is increased in proportion with the square of electric current, wiring has to be done not by usual cables but by bus bars, particularly, in a region in which the current exceeds 1000A, which increases the difficulty in an assembling work.
3. As the current flowing in the cable increases, the intensity of a magnetic field caused thereby is also increased, which gives an effect on the movement of an arc spot to result in undesired effect such as localization of discharge.
4. Even if an evaporation surface of a large area is provided, the arc spot tends to localize to a portion of an evaporation surface to possibly cause uneven evaporation.
5. As the discharge current becomes greater, a current concentrated portion is formed not only on the surface of the cathode but also on the surface of the anode (anode spot) to possibly damage that portion.

Accordingly, even if an evaporation source of a large evaporation area is used, since the arc discharge current can not be increased in proportion with the evaporation area by the reason described above, there has been a problem that the film formation rate in average is reduced. As a result, in an application use requiring a high film formation rate, a necessary film formation rate can not be attained by an evaporation source of a large area. Therefore, large-scaled evaporation source can be constituted.

SUMMARY OF THE INVENTION

It is therefore an object of the present invention to provide a vacuum arc vapor deposition device having a large evaporation area and a high film formation rate.

The foregoing object can be attained in accordance with the present invention by providing a vacuum arc deposition device wherein a vacuum cathode arc discharge is generated between a cathode 3 and an anode 4 of one or more vacuum arc evaporation sources 1 by supplying an arc electric power from an arc discharge power source to each vacuum arc evaporation source 1 disposed in a vacuum vessel 2 for evaporating an evaporation material from the evaporation surface 9 of a target 6 on the side of the cathode 3 and depositing the vapor on a substrate 7 disposed in the vacuum vessel 2 to form a deposition film, characterized in that a plurality of arc discharge power sources 5 capable of controlling their own current outputs are disposed, and a plurality of arc current introduction portions 15 independent of each other are disposed to the vacuum arc evaporation source 1, whereby the arc electric power is supplied from each of the arc discharge power sources 5 simultaneously to the vacuum arc evaporation source 1 by way of each of the arc current introduction portions 15.

A plurality of the arc discharge power sources 5 can control their own output current, respectively. This can surely distribute the current flowing to the vacuum arc evaporation source 1 from each of the power sources 5. As a result, from the arc discharge power sources 5 each having such an electric current capacity of several hundreds amperes that can be easily attained technically, a discharge current several times as great as the above individual current capacity can be supplied to the evaporation source 1.

Therefore, such a large capacity power source as being difficult in the realization is no more necessary. Further, since the current is supplied from each of the independent power sources 5 to each of independent arc current introduction portions 18, the value of the current flowing to the power source system is divided and can be supplied with ease through a cable or the like to facilitate the assembling operation and subsequent handling. In addition, since the current flows not concentrically in a restricted path but flows under distribution, there yields an effect of offsetting generated magnetic fields to each other and the localization of the arc spot by magnetic fields caused by electric current is less generated. Further, since the current is supplied under distribution to the evaporation source 1, there is no problem that the arc spot is localized to a portion near the current supply portion.

As a further desired embodiment, each of independent anodes 4 may be disposed correspondingly to each of the arc discharge power sources 5. Disposition of the independent anodes 4 can provide an advantageous effect capable of controlling the discharge current flowing to each of the anodes 4 by each of the arc discharge power sources 5. When the discharge current is increased in the vacuum arc evaporation source 1, a so called anode spot is often formed on the side of the anodes 4 to bring about a problem of damaging the anodes 4. However, the current flowing into each of the anodes 4 can be kept to less than a level of causing the anode spot by the above-mentioned method, to hinder the injury of the anodes 4. Further, by disposing the independent anodes 4, on the evaporation surface 9 near each of the anodes 4, an arc spot on the side of a corresponding cathode 3 can be maintained to some extent, which yields an effect capable of stabilizing the distribution of the film formation rate.

A further preferred effect is that the distribution of the film formation rate to the substrate 7 can be made uniform by appropriately setting the value of the current from each of the arc discharge power sources 5 connected to the vacuum arc evaporation source 1. That is, when it is assumed to form a film at a uniform thickness in the longitudinal direction of the substrate 7 disposed opposing to the evaporation source 1 having the rectangular evaporation surface 9, the film thickness on the substrate 7 is reduced near the end of the evaporation source 9 as shown in FIG. 5, although uniform evaporation can be carried out on the evaporation surface in the conventional evaporation source 1. On the other hand, according to the present invention, more uniform distribution for the film thickness can be obtained as shown in FIG. 6 by setting the value of the current from the arc discharge power source 5 for supplying a current near the end of the evaporation surface 9 somewhat higher as compared with other power sources. Although such a distribution of the evaporation amount actually deviates from the ideal one, a satisfactory distribution for the film thickness can be obtained, by experimentally determining the optimum current balance for each of the power sources.

As still a further preferred embodiment, the value of each current flowing from each of the arc discharge power sources 5 connected to the vacuum arc evaporation source 1 may be changed with an elapse of time. For example, each current supplied to each portion of the vacuum arc evaporation source 1 is controlled to be changed with an elapse of time while the total currents are kept constant, as shown in a current-time chart of FIG. 8A. In this case, an arc spot will be generated in the surroundings of the current introduction portion having current supplied thereto and the position of the arc spot is changed by changing the anodes to which current is supplied with an elapse of time. Therefore it is possible to control the position of the arc spot with the elapse of time. By using the above, it is possible to control the position of high film formation rate on the substrate and to obtain an uniform distribution for the film thickness by repeatedly carrying out such a control as shown in FIG. 8A during the film forming process

BRIEF DESCRIPTION OF THE DRAWINGS

FIG. 7 is a side cross sectional view showing an embodiment of the prior art;

DETAILED DESCRIPTION OF THE PREFERRED EMBODIMENTS

Hereinafter the preferred embodiments according to the present invention will be now described in detail with reference to the drawings.

Figure 1:
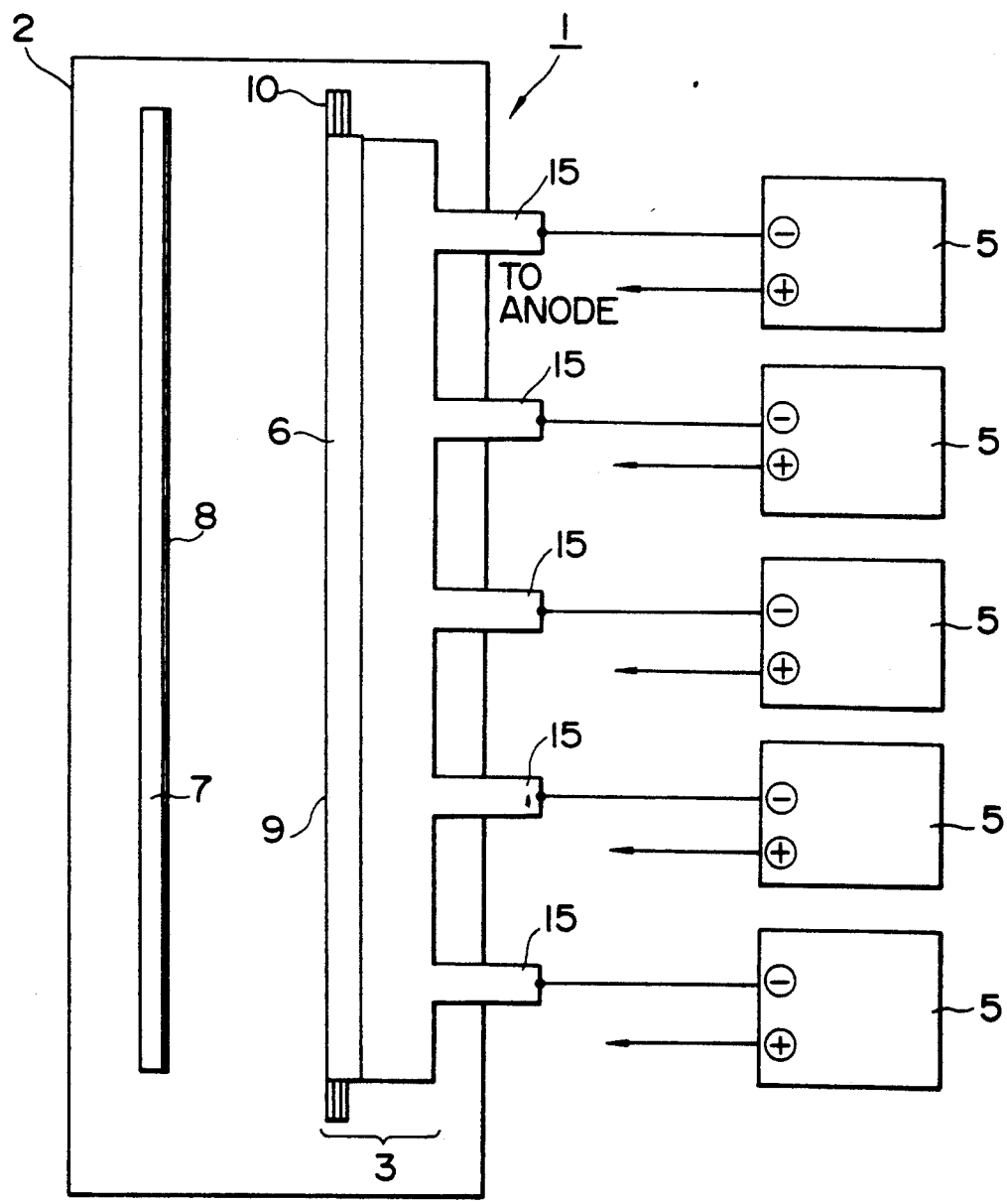
FIG. 1 is a side cross sectional view showing one embodiment according to the present invention.
Figure 2:
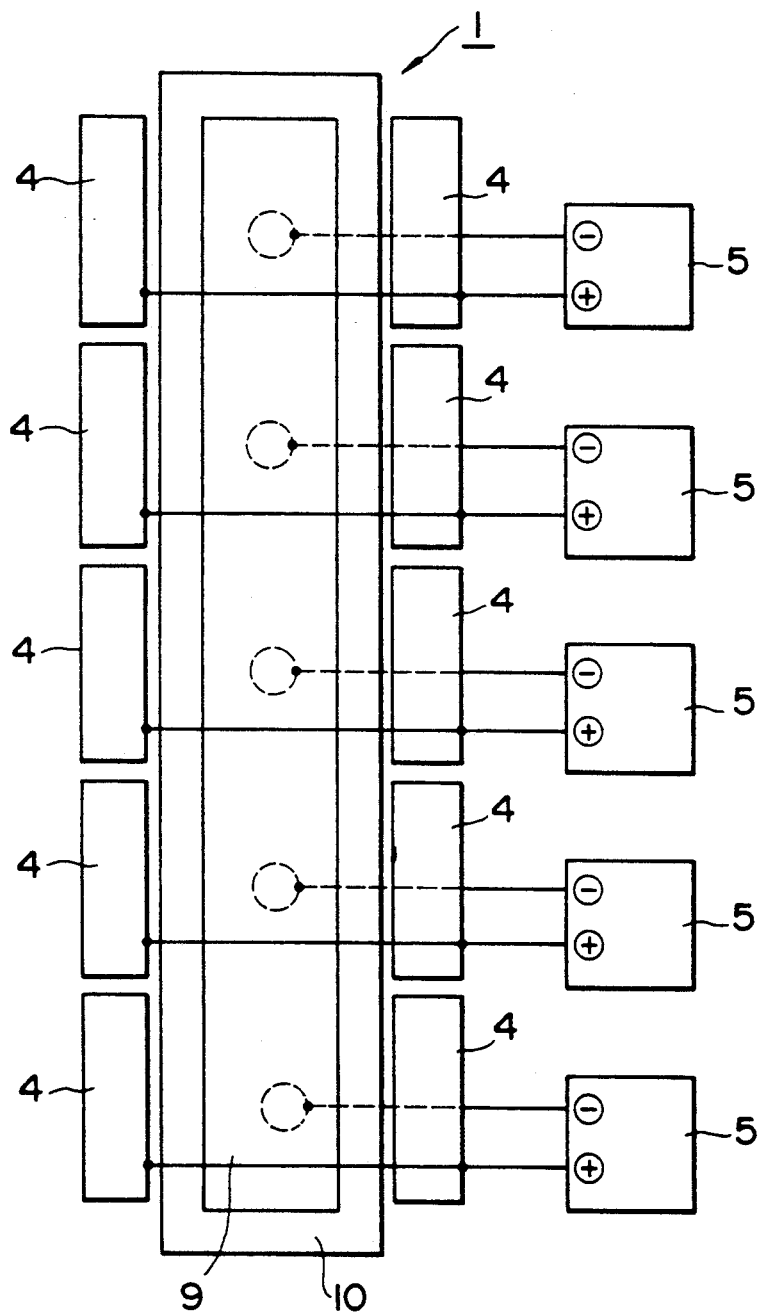
FIG. 2 is a front view thereof.

In FIGS. 1 and 2, each of one or more vacuum arc evaporation source 1 has an evaporation surface 9 having substantially an identical width with that of a substrate 7. The fundamental structure of the evaporation source 1 is the same as that described for the prior art with reference to FIG. 7. For this embodiment, detailed structures for the cooling mechanism or the like are omitted and the identical portions are shown with the identical reference numerals without duplicate explanation. The feature of this embodiment is that the evaporation source 1 is driven by a plurality of arc discharge power sources 5. In the drawing, five arc power sources are disposed but the number of the arc power sources is not restricted only to five but they may be disposed by an optional number as required.

Correspondingly to a plurality of the arc discharge power sources 5, arc electric power is supplied from a plurality of independent arc current introduction portions 15 to the vacuum arc evaporation source 1. A plurality of anodes 4 are disposed at the positions approximately corresponding to respective arc current introduction portions 15. The anodes 4 are watercooled generally by a structure not illustrated and, preferably, insulated electrically from the vacuum vessel 2 and from each other. If the current to be distributed to each of the anodes 4 is accurately defined by each of he arc discharge power sources 5 connected thereto, it is advantageous in view of the uniformity for the distribution of the film thickness and in view of the suppression for the generation of the anode spot which would possibly damage the anode. However, in a case where here is no worry for the injury of the anode depending on the value of current used, it is possible to use a single anode 4 or to use the vacuum vessel 2 itself as the anode for the sake of the structure.

The arc current introduction portions 15 of the evaporation source 1 are arranged at positions distributed as uniformly as possible to the evaporation surface 9. This enables to obtain uniform evaporation over the entire evaporation surface 9. Further, since the supply of the arc current is distributed by arranging the arc current introduction portions 15 under distribution, localization of the arc spot by the current-induced magnetic field that is generated upon charging a large current can be mitigated by offsetting the distributed currents to each other.

Each of the arc discharge power sources 5 used in this device has a function of controlling the output current of its own. Otherwise, when they are operated in parallel, a greater discharge current would be concentrated to a power source connected to a circuit of a relatively lower impedance as compared to others. As the output capacity of the power source 5, about from 100A to 400A of the capacity is practical since a capacity of greater than 500A makes the cable wiring operation for the output substantially difficult, which is contrary to the gist of the present invention, whereas too small capacity is not desirable in view of the film formation rate.

The arc discharge power source 5 having the performance as described above can be basically attained with easy by a circuit system equivalent with that for existent power source used at present for welding. In addition, it can be achieved easily by cable wiring in view of the current capacity. Accordingly, an evaporation amount corresponding to the discharge current as high as several thousands amperes can be realized with ease.

It is desirable that the wiring operation for supplying the arc discharge current to the evaporation source 1 is applied with the wirings for both of positive and negative electrodes being as close as possible, because magnetic fields caused by electric current flowing through the wirings for both of the positive and negative electrodes offset to each other, thereby minimizing the effect given on the movement of an arc spot. It is desirable to dispose the independent anodes 4 near the corresponding arc current introduction portions 15 since the flowing path of the discharge current can be defined short, to minimize the magnetic fields. This is important in uniformly dispersing the arc spot on the evaporation surface 9 and making the distribution of the film thickness uniform on the substrate 7.

The current supplied from each of the arc discharge power sources 5 is basically distributed uniformly from the entire discharge current in view of uniform evaporation from the entire evaporation surface 9. However, if the film thickness tends to be reduced at both ends of the substrate 7, for instance, it is advantageous for practicing the present invention to set the output current from the arc discharge power sources 5 connected to both ends of the evaporation source 1 to somewhat greater, for attaining the uniform film thickness on the substrate 7.

Figure 3:
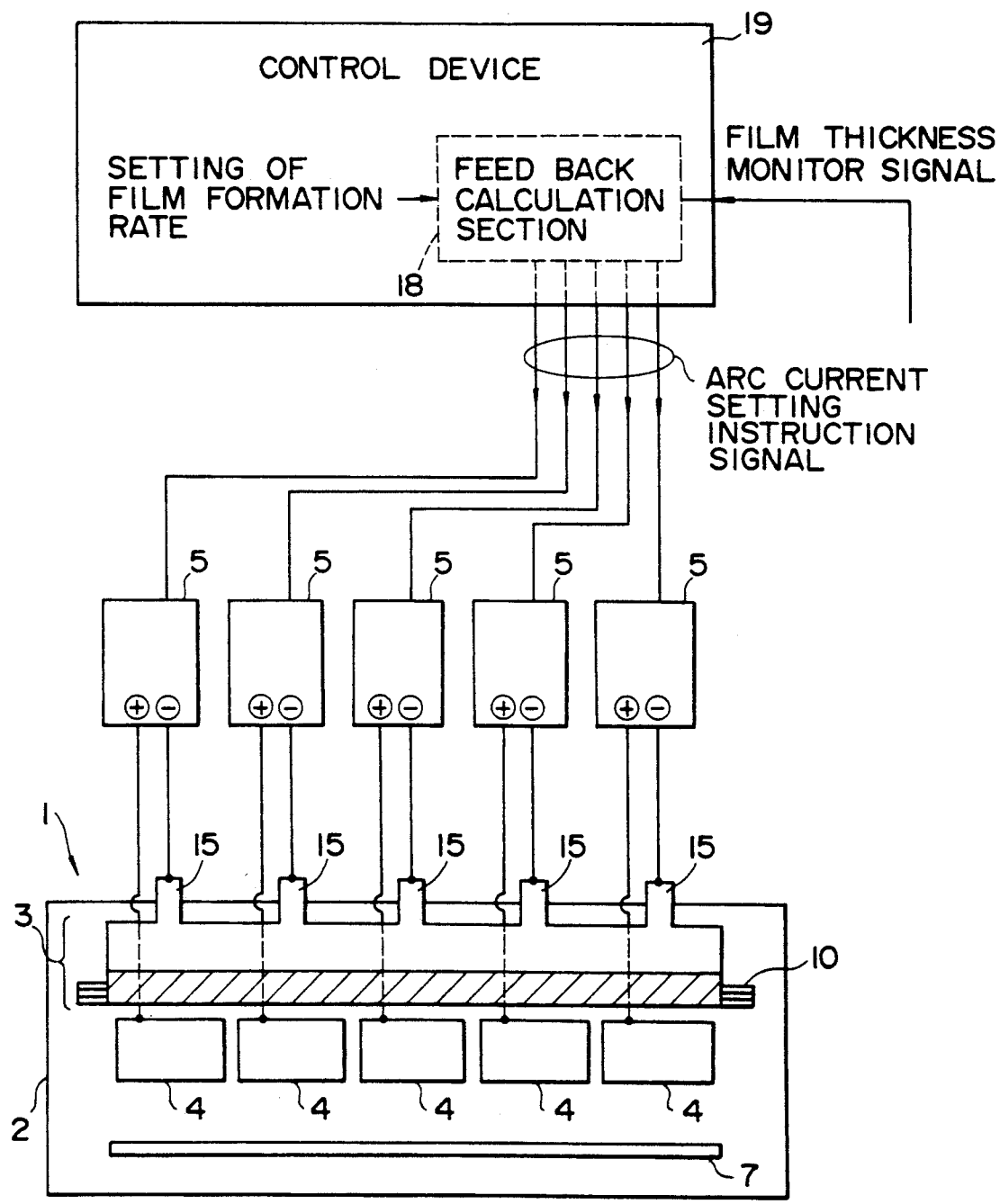
FIG. 3 is a side cross sectional view showing another embodiment according to the present invention.
Figure 4:
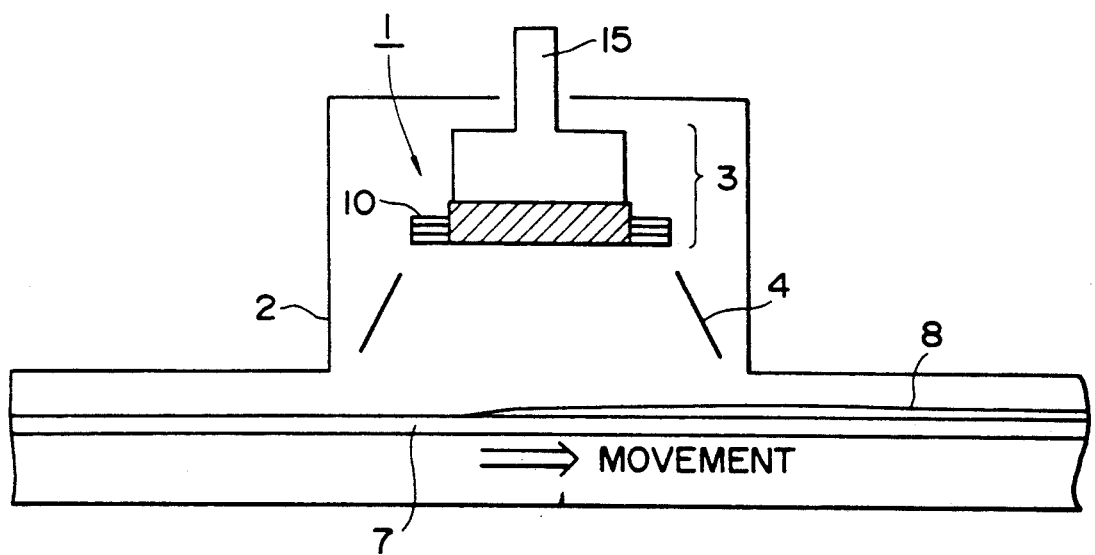
FIG. 4 is a front view thereof.
Figure 5:
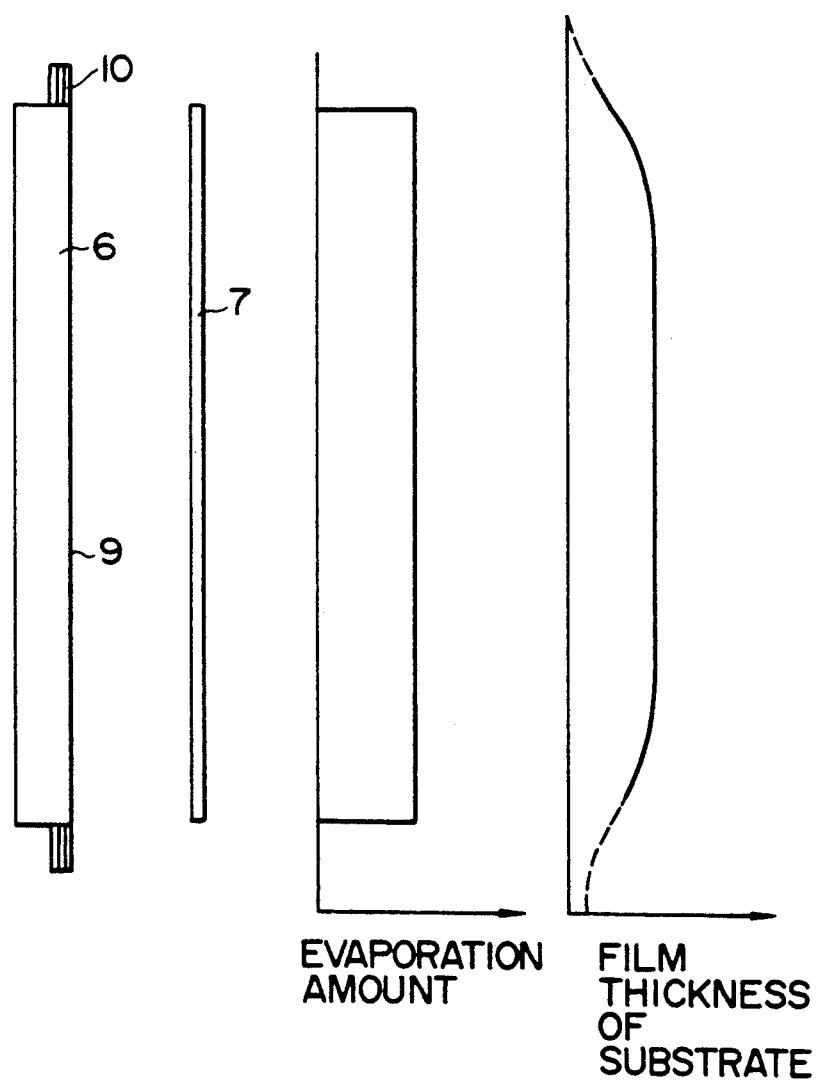
FIG. 5 is a function illustrative view showing relationship between the evaporation amount from the evaporation surface and the film thickness on the substrate.
Figure 6:
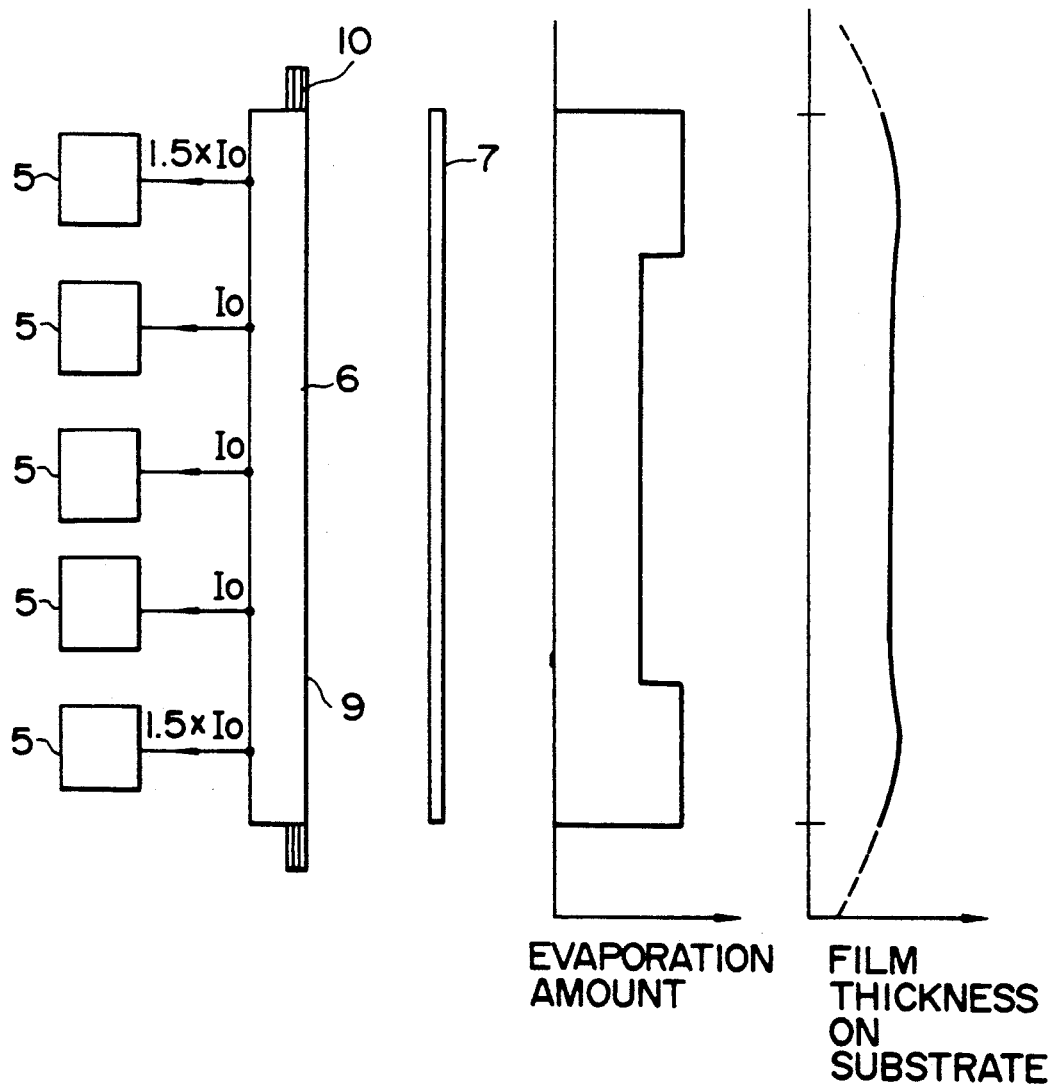
FIG. 6 is a function illustrative view showing a relationship between the evaporation amount from the evaporation surface and the film thickness on the substrate.

FIGS. 3 and 4 illustrate another embodiment in which a film 8 is formed at a high speed, for instance, on a steel plate or a building glass plate with a width of greater than about 1 m used as a substrate 7.

As shown in FIG. 3, a film 8 is formed while continuously passing the substrate 7 as described above in front of the evaporation source 1 and a vacuum arc evaporation source 1 elongate in the direction perpendicular to the moving direction of the substrate 7 is attached, thus forming a film uniformly to the lateral direction of the substrate 7 by one evaporation source 1. For increasing the moving speed of the substrate 7 to attain a high productivity in such a device, a high evaporation rate is necessary as a matter of fact.

For instance, in a case of using titanium as a target for forming a titanium nitride film, the evaporation amount is about 0.1 g per amount of the discharge current of 1 AHr irrespective of the evaporation area of the evaporation source 1 as a result of experiment. For instance, it is assumed that the rectangular evaporation source 1 with a longer side of about 1 m length is used for a continuous substrate 7 of 1 m width and about 80% of the evaporation amount can be deposited as a TiN film on the substrate, and that a film of 1000Å thickness can be formed by using 200A of the discharge current, which is typical as the vacuum arc evaporation source. By calculation from the above-mentioned evaporation amount, the length of the substrate that can be vapor-deposited per one hour is about 40 m. However, a processing performance from five to ten times as large as the above is actually required.

As one of countermeasures, there may be considered a method of disposing such evaporation sources by the number of five or tens in parallel, but this enlarges the scale of the vacuum apparatus and is not so acceptable from an industrial point of view. Alternatively, there may be a method of disposing small-sized evaporation sources by the number of five to tens. In this case, the scale of the vacuum apparatus is not so enlarged but, since a plurality of evaporation sources are driven, there is a problem such that the entire apparatus has to be stopped if one of the evaporation sources is failed, and it is neither so acceptable constitution from an industrial point of view. It seems to be a most acceptable dissolution to increase the discharge current for an evaporation source by from five to ten times. However, since the discharge current reaches as high as 1000A or 2000A, this is also difficult to be achieved with the reasons as described above.

On the contrary, by supplying the electric power, for instance, from five arc discharge power sources 5 to one vacuum arc evaporation source 1 as shown in FIGS. 3 and 4, discharge with a current as high as about 1000A becomes possible which enables uniform and high speed film formation.

Further, in the embodiment shown in FIGS. 3 and 4, a control device 19 having a feedback calculation section 18 is disposed as shown in FIG. 3 and the film thickness for the portion formed with a film is measured, which is fed back as a film thickness monitor signal to the control device 19 to determine the balance between each of the output currents in comparison with the setting value for the film formation rate, and an arc current setting instruction signal is sent to the arc discharge power source, to thereby obtain an uniform film thickness. This is an extremely important mode from an industrial point of view in a case of applying continuous processing as in this embodiment.

The object of the present invention can also be attained by setting the current to each of the arc discharge power sources 5 manually by an operator. However, since the maximum effect can be attained by the feedback control as described above, it is desirable that each of the arc discharge power sources 5 has a circuit for receiving the instruction signal from the control device 19 and capable of determining the control current therefor.

Figure 8A:
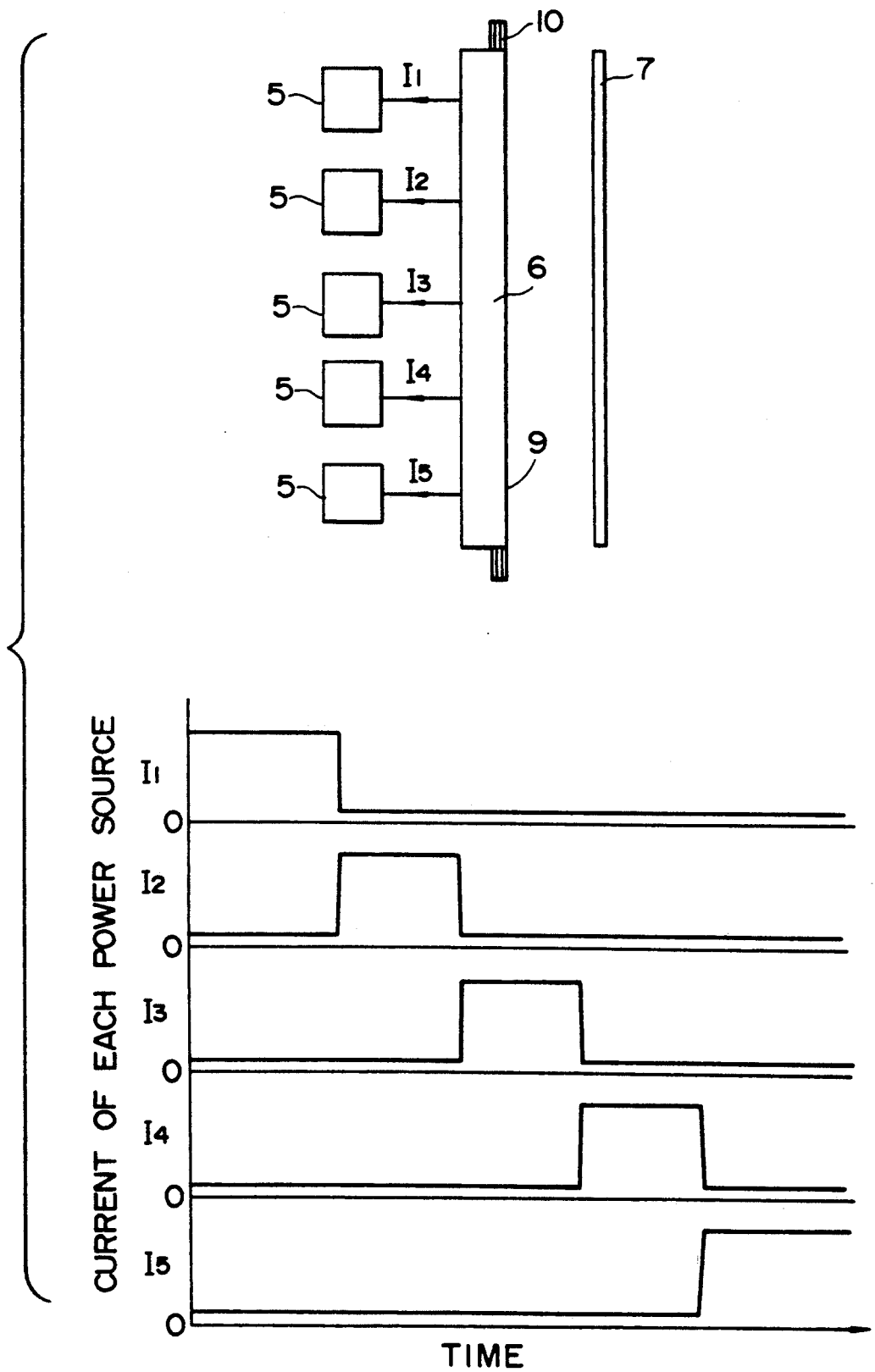
FIG. 8A is a schematic view showing the change in the current from each power source with an elapse of time.
Figure 8B:
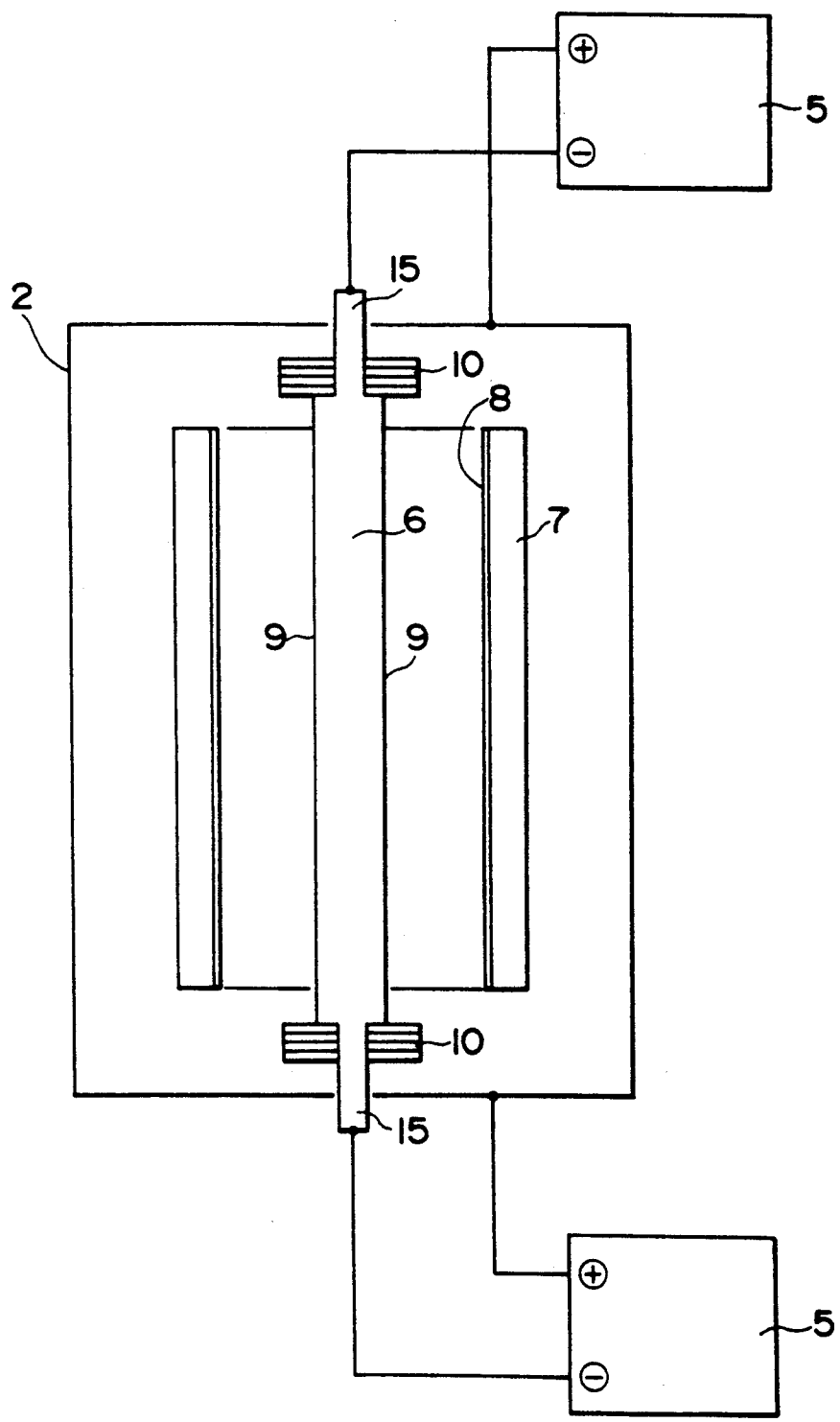
FIG. 8B is a side cross sectional view showing an apparatus having a cylindrical evaporation surface according to still another embodiment.
Figure 8C:
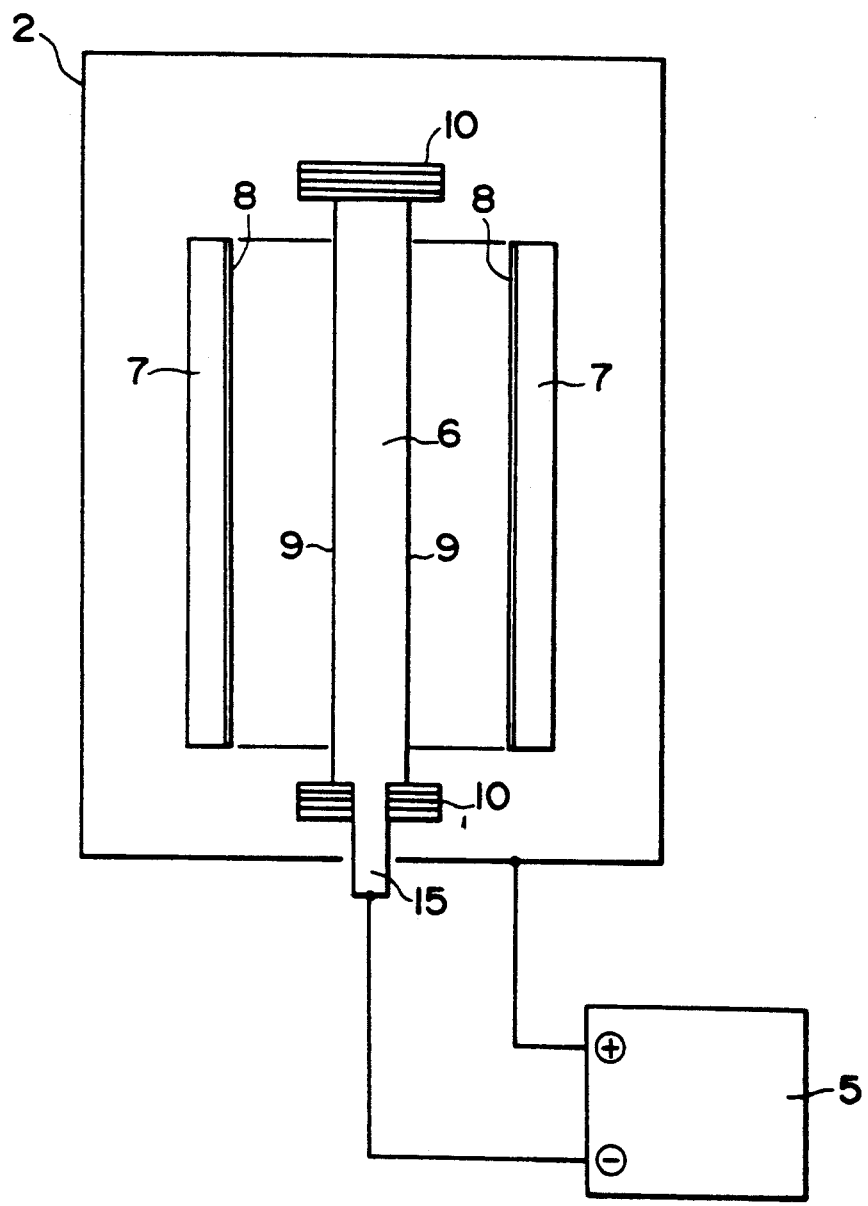
FIG. 8C is a side cross sectional view showing an apparatus having a cylindrical target according to still another embodiment.

The still further embodiment according to the present invention is shown in FIG. 8B, wherein there is provided an apparatus obtained by improving the apparatus having a cylindrical evaporation surface disclosed in Japanese Patent Publications Nos. sho 52-14690 and hei 3-17795. FIG. 8C shows an apparatus having the cylindrical target basically identical to that of the apparatus described in Japanese Patent Publication No. sho 52-14690. The apparatus disclosed in Japanese Patent Publication No. sho 52-14690 is advantageous to form the film on the inner surface of a cylindrical substrate 7 because of the cylindrical outside surface of the evaporation surface 9. However, in the constitution of the above apparatus, the arc spot is liable to generate near the arc current introduction portion 15 on the evaporation surface 9, which prevent evaporation from being emitted from the entire cylindrical surface and particularly, in the inner coating of a long-sized pipe, the satisfied distribution of the film thickness can not be obtained.

Further, in Japanese Patent Publication No. hei 3-17795, there is repeatedly carried out such a process that the arc is ignited at each of both ends of the cylindrical evaporation surface and the arc spot is move from the end to the arc introduction portion and vanished to thereby obtain the coating being comparatively excellent in uniformity. However, with this constitution, the evaporation is intermittently carried out, thereby being poor in productivity.

On the contrary, in the present embodiment, both the ends of the cylindrical evaporation source 6 are made to be the current introduction portions 15, which are connected to respective arc discharge power sources 5 capable of controlling their own current outputs. With this constitution, the arc discharge current from both the ends of the evaporation surface 9 is supplied, thereby enabling such a continuous deposition that arc spots are distributed on the entire cylindrical surface.

In this case, the position where the arc spots are concentrated and the evaporation are liable to generate is controlled according to the supply ratio of the arc current from both the ends of the evaporation surface 9. Consequently, the film thickness can be controlled. Further, by controlling the supply ratio of the arc current from both the ends of the evaporation surface 9 with an elapse of time, the distribution for film formation rate can be controlled, and also by repeatedly carrying out the control, the uniform distribution for the film thickness can be realized.

In this embodiment, the arc discharge current is supplied only from both the ends of the cylindrical evaporation source. However, a mechanism for supplying the current to the inside of the evaporation source may be added, and further the numbers of both the arc current introduction portions and the arc discharge power sources may be increased.

As has been described above, the present invention of operating a vacuum arc evaporation source 1 of a large area at a high arc current and, as a result, capable of obtaining an aimed great film-forming rate, as well as preventing the damage of the anode 4 caused by large current, stabilizing and unifying of the distribution of the film thickness.

What is claimed is:

1. A vacuum arc deposition device comprising:
   a vacuum vessel,
   a vacuum arc evaporation source disposed in said vacuum vessel,
   a plurality of arc current introduction portions which are each electrically connected to the vacuum arc evaporation source for arc evaporating the evaporation source, and
   an arc discharge power source means for supplying arc electric power to the arc current introduction portions, comprising a plurality of arc discharge power sources.

2. A vacuum arc vapor deposition device, comprising:
   a vacuum vessel,
   a vacuum arc evaporation source disposed in said vacuum vessel,
   a plurality of arc current introduction portions which are each electrically connected to said vacuum arc evaporation source for arc evaporating the evaporation source,
   an arc discharge power source means for supplying arc electric power to the arc current introduction portions, and
   wherein said arc discharge power source means comprises arc discharge power sources for controlling current outputs to each of the arc current introduction portions.

3. A vacuum arc vapor deposition device, comprising:
   a vacuum vessel,
   a vacuum arc evaporation source disposed in said vacuum vessel,
   a plurality of arc current introduction portions which are each electrically connected to said vacuum arc evaporation source for arc evaporating the evaporation source,
   an arc discharge power source means for supplying arc electric power to the arc current introduction portions, and
   wherein said vacuum arc evaporation source comprises a plurality of independent anodes which electrically connect to a corresponding plurality of arc discharge power sources of said arc discharge power source means, respectively.

4. A vacuum arc vapor deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means, comprising arc discharge power sources, for supplying arc electric power to the arc current introduction portions, wherein the number of arc discharge power sources of said arc discharge power source means and the number of said arc current introduction options are identical.

5. A vacuum arc vapor deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions,
wherein said arc current introduction portions are disposed at positions uniformly distributed relative to an evaporation surface for evaporation.

6. A vacuum arc vapor deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions, and
further comprising means for simultaneously supplying arc electric power from the plurality of arc discharge power sources of said arc discharge power source means by way of at least two of the arc current introduction portions to said vacuum arc evaporation source.

7. A vacuum arc vapor deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions,
wherein the arc discharge power source means comprises arc discharge power sources and the discharge current capacity of each of said arc discharge power sources is from 100A to 400A.

8. A vacuum arc vapor deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions, and
further comprising a control device having a feedback calculation section for comparing film thickness for a portion of the substrate upon which film has been deposited, with film formation rate.

9. A vacuum arc deposition device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions and
further comprising a control device for controlling respective currents supplied from a plurality of arc discharge power sources of said arc discharge power source means through corresponding arc current introduction portions to said vacuum arc evaporation source so as to vary the supplied currents with an elapse of time.

10. A vacuum arc evaporation device, comprising:
a vacuum vessel,
a vacuum arc evaporation source disposed in said vacuum vessel,
a plurality of arc current introduction portions which are each electrically connected to said vacuum arc evaporation source for arc evaporating the evaporation source,
an arc discharge power source means for supplying arc electric power to the arc current introduction portions, and
wherein currents flowing from a plurality of arc discharge power sources of said arc discharge power source means through said respective arc current introduction portions to said vacuum arc evaporation source vary periodically.

11. A method for vacuum arc vapor deposition, comprising the steps of:
supplying discharge currents from a plurality of arc discharge power sources to a plurality of cathode arc current introduction portions, wherein said cathode arc current introduction portions are electrically connected to a vacuum arc evaporation source in a vacuum vessel for evaporation of the evaporation source, thereby arc evaporating the evaporation source.

12. A method for vacuum arc vapor deposition, comprising the steps of:
supplying discharge currents from a plurality of arc discharge power sources to a plurality of arc current introduction portions, wherein said arc current introduction portions are electrically connected to a vacuum arc evaporation source in a vacuum vessel; and further comprising the steps of measuring the film thickness of a film portion on a substrate and, feeding the measured film thickness to a control device for controlling current outputted from each of said arc power sources.

13. A method for vacuum arc vapor deposition, comprising the steps of:

supplying discharge currents from a plurality of arc discharge power sources to a plurality of arc current introduction portions, wherein said arc current introduction portions are electrically connected to a vacuum arc evaporation source in a vacuum vessel; and further comprising the step of controlling currents supplied from a plurality of the arc discharge power sources through said respective arc introduction portions to said vacuum arc evaporation source, thereby varying the relative arc currents from the various arc discharge power sources as a function of time.

14. A method for vacuum arc vapor deposition, comprising the steps of:

supplying discharge currents from a plurality of arc discharge power sources to a plurality of arc current introduction portions, wherein said arc current introduction portions are electrically connected to a vacuum arc evaporation source in a vacuum vessel for evaporation of the evaporation source, thereby arc evaporating the evaporation source; and further comprising periodically changing the currents from the plurality of arc discharge power sources.

15. A device according to claim 1, wherein:

one of the arc current introduction portions is electrically connected to one of the arc discharge power sources, to receive arc current for arc evaporating the evaporation source from said one of the arc discharge power sources.

16. A vacuum arc evaporation device, comprising:
an evaporation surface;
an arc discharge power supply; and
a plurality of cathode arc current introduction portions electrically connected to the evaporation surface and to the arc discharge power supply, for supplying arc electric power to the evaporation surface.

17. A vacuum evaporation device according to claim 16, further comprising:

a vacuum vessel;

wherein the evaporation source is in the vacuum vessel;

wherein each cathode arc current introduction portion has an outside portion outside of the vacuum vessel and an inside portion inside the vacuum vessel.

18. A vacuum arc evaporation device, according to claim 17, wherein:

the outside portions of the cathode arc introduction portions are not connected to one another.

19. A vacuum evaporation device according to claim 18, wherein the evaporation surface is the surface of an evaporation source, and further comprising:

means for fixedly supporting the evaporation source relative to the vacuum vessel, said means for fixedly supporting being inside the vacuum vessel; and wherein said arc current introduction portions are electrically connected to the evaporation source and to one another through connection to the means for fixedly supporting.

20. A vacuum evaporation device according to claim 19, further comprising:

additional arc discharge power supplies, in addition to said arc discharge power supply, all of the arc discharge power supplies are electrically connected to the evaporation source via electrical connection to outside portions of the cathode arc introduction portions.

21. A vacuum evaporation device according to claim 20, wherein each of the plurality of vacuum arc evaporation power supplies is connected to a single one of the cathode arc introduction portions.

* * * * *